United States Patent [19]
Schroeder et al.

[11] Patent Number: 5,289,119
[45] Date of Patent: Feb. 22, 1994

[54] TRANSPARENT ENABLE TEST CIRCUIT

[75] Inventors: Duane A. Schroeder, White Bear Lake; David M. Hime, Blaine, both of Minn.

[73] Assignee: Unisys Corporation, Blue Bell, Pa.

[21] Appl. No.: 870,865

[22] Filed: Apr. 20, 1992

[51] Int. Cl.⁵ .............................................. G01R 31/28
[52] U.S. Cl. ............................ 324/158 T; 324/158 R; 324/73.1; 371/22.3
[58] Field of Search .......................... 324/158 R, 73.1; 371/15.1, 22.4, 24, 25.1, 22.3; 307/272.2, 303.1

[56] References Cited

U.S. PATENT DOCUMENTS 4,698,588 10/1987 Hwang et al. ................... 324/158 R
5,047,710 9/1991 Mahoney ........................ 324/158 R
5,122,738 6/1992 Simpson et al. ................. 324/158 T
5,130,568 7/1992 Miller et al. .................... 324/158 R Primary Examiner—Vinh Nguyen
Attorney, Agent, or Firm—John B. Sowell; Glenn W. Bowen; Charles A. Johnson

[57] ABSTRACT

A test circuit for two level latches on an integrated circuit to be tested includes a test enable driver circuit coupled to a third level switch which is connected in series between the latches to be tested and a low voltage source. The third level switch converts the two level latches to be tested into a buffer such that data applied as an input to the two level latches appears in identical form as data at the output pin of the integrated circuit chip.

12 Claims, 3 Drawing Sheets

TRANSPARENT ENABLE TEST CIRCUIT

BACKGROUND OF THE INVENTION

1. Field of the Invention

The present invention relates to test circuits on-board integrated circuit chips. More particularly, the present invention relates to test circuits having an input which overrides all flip-flop or latch inputs such that data into the chip becomes data out, thus, converting the flip-flop or latch into a non-inverting buffer.

2. Description of the Prior Art

Heretofore, scan set latch circuits were known and used on-board integrated circuit chips to implement series scan test patterns. Such prior art scan set latch circuits are known to require sequentially clocking of a pattern into the series string of latches to obtain test patterns out. Such series scan test circuits when tested on a chip using scan set latch circuits requires a complex setup as well as three or more dedicated pins on the chip in addition to a clock input pin.

It would be desirable to simplify the prior art scan set test circuits and procedure without requiring any significant on-board chip circuitry.

SUMMARY OF THE INVENTION

It is a primary object of the present invention to provide a novel transparent test circuit for on-chip testing of logic circuits.

It is a primary object of the present invention to provide a novel transparent test circuit which is implemented by the addition of a single test enable pin to the chip to be tested.

It is another primary object of the present invention to provide a novel transparent test circuit which virtually eliminates the on-chip test circuits associated with series scan set test circuits and replaces them with a lesser number of components in the form of a simple and reliable test circuit.

It is another primary object of the present invention to provide a novel transparent test circuit which permits very simple setup and test procedures, thus, eliminating the complex setup and test procedures associated with prior art series scan set test circuits.

It is another primary object of the present invention to provide a novel test circuit which costs less to implement and is cheaper to use in testing than the test circuits used in the prior art.

According to these and other objects of the present invention, there is provided a novel test circuit which comprises a test enabled driver circuit coupled to a third level switch which is added to the flip-flop or latch to be tested. The third level switch converts the flip-flop or latch into a buffer such that data applied to the flip-flop or latch appears in its identical form as output data at the chip output pin without the necessity of a clock driver.

BRIEF DESCRIPTION 0 DRAWINGS

DETAILED DESCRIPTION OF THE PREFERRED EMBODIMENTS

Figure 1:
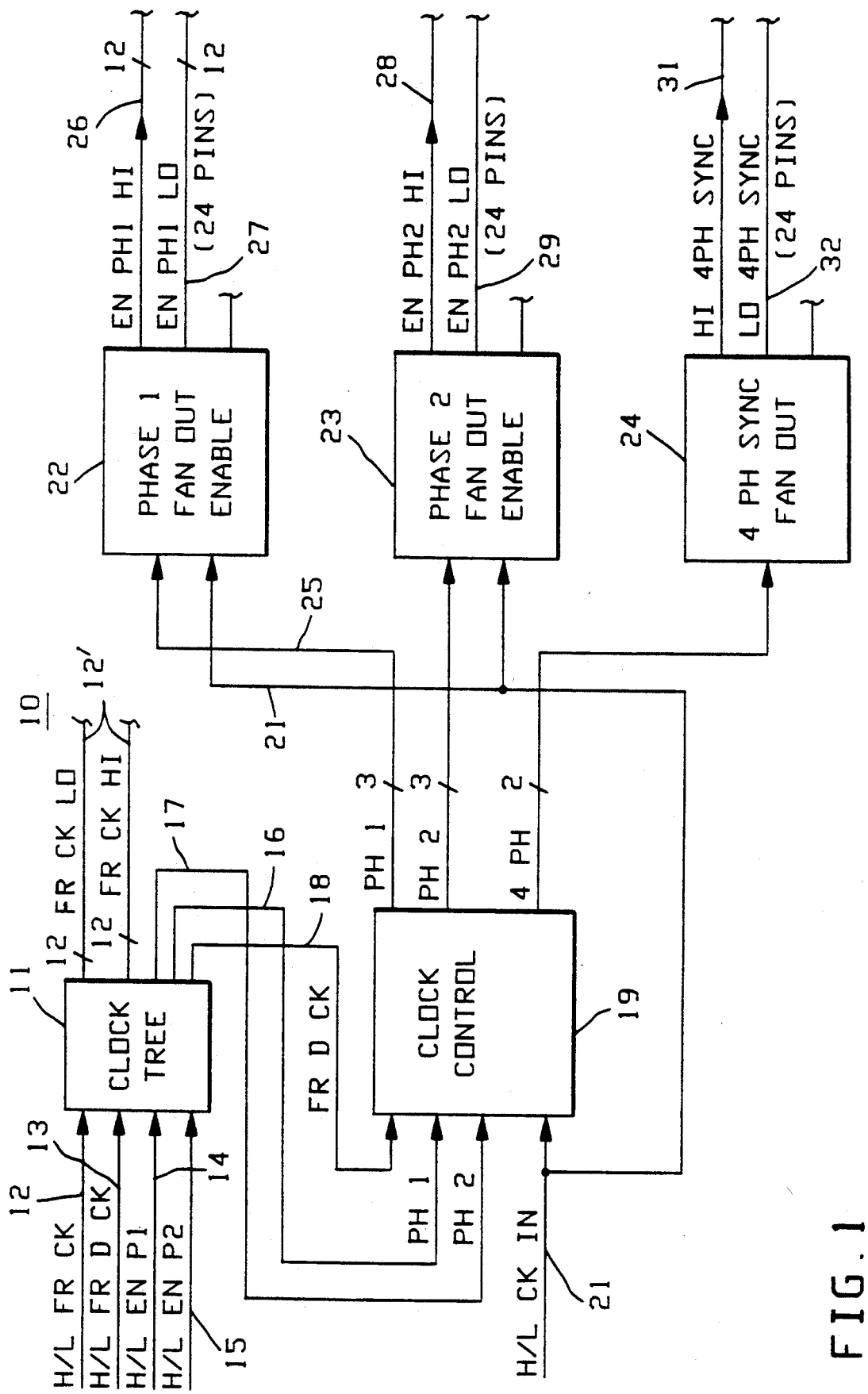
FIG. 1 is a block diagram representative of a master clock chip of the type used in large high speed mainframe computers and is a typical chip that requires precise on-board test circuits.

Refer now to FIG. 1 showing a block diagram of a typical master clock chip of the type which would embody the present invention. The master clock chip 10 comprises a clock fan out tree 11 of the type which produces multiple clock outputs from the singular inputs. The inputs to clock tree 11 are shown as high/low free running clock line 12 and a high/low free running delay clock line 13. The inputs 14 and 15 are high/low enable phase one and phase two inputs. Five outputs are shown from the clock tree 11, the phase one output on line 16, the phase two output on line 17 the free running delay clock output on line 18 and the twelve high and twelve low clocks on lines 12, These are three of the inputs to the clock control 19 which has numerous other inputs. A fourth input is shown as a high/low clock IN on line 21. The clock on line 21 is shown being applied to a phase one fan out enable circuit 22 and a phase two fan out enable circuit 23.

Block 22 is shown having an input 25 which comprises three separate inputs all associated with phase one. The phase one fan out enable circuitry 22 produces 24 phase one enable outputs on 24 pins shown as 12 pins having enable phase one high and 12 pins having enable phase one low on lines 26 and 27, respectively.

In a similar manner, the phase two fan out enable circuitry 23 is shown having three separate phase two associated inputs to produce 24 outputs comprising 12 copies of the enable phase two high on line 28 and 12 copies of the enable phase two low on line 29. It will be understood that these 48 phase one and phase two outputs are to be used throughout a large highspeed mainframe computer.

The four phase sync fan out circuit 24 is shown having two inputs associated with phase four to produce 12 four phase sync high outputs on line 31 and 12 low four phase sync outputs on line 32.

Test procedures for testing and accepting a chip of the type shown in FIG. 1 would comprise checking all phase one to phase one deviations against each other and checking all phase two to phase two deviations against each other and checking all four phase sync signals against each other and in the final analysis all the above signals must correctly window the signals from the mater oscillator (not shown) which does not include such test circuits to be described hereinafter. It will be understood that all of the delays and adjustments have been designed into the integrated circuit chip and the test procedure is designed to approve or reject a chip for commercial use.

Figure 2:
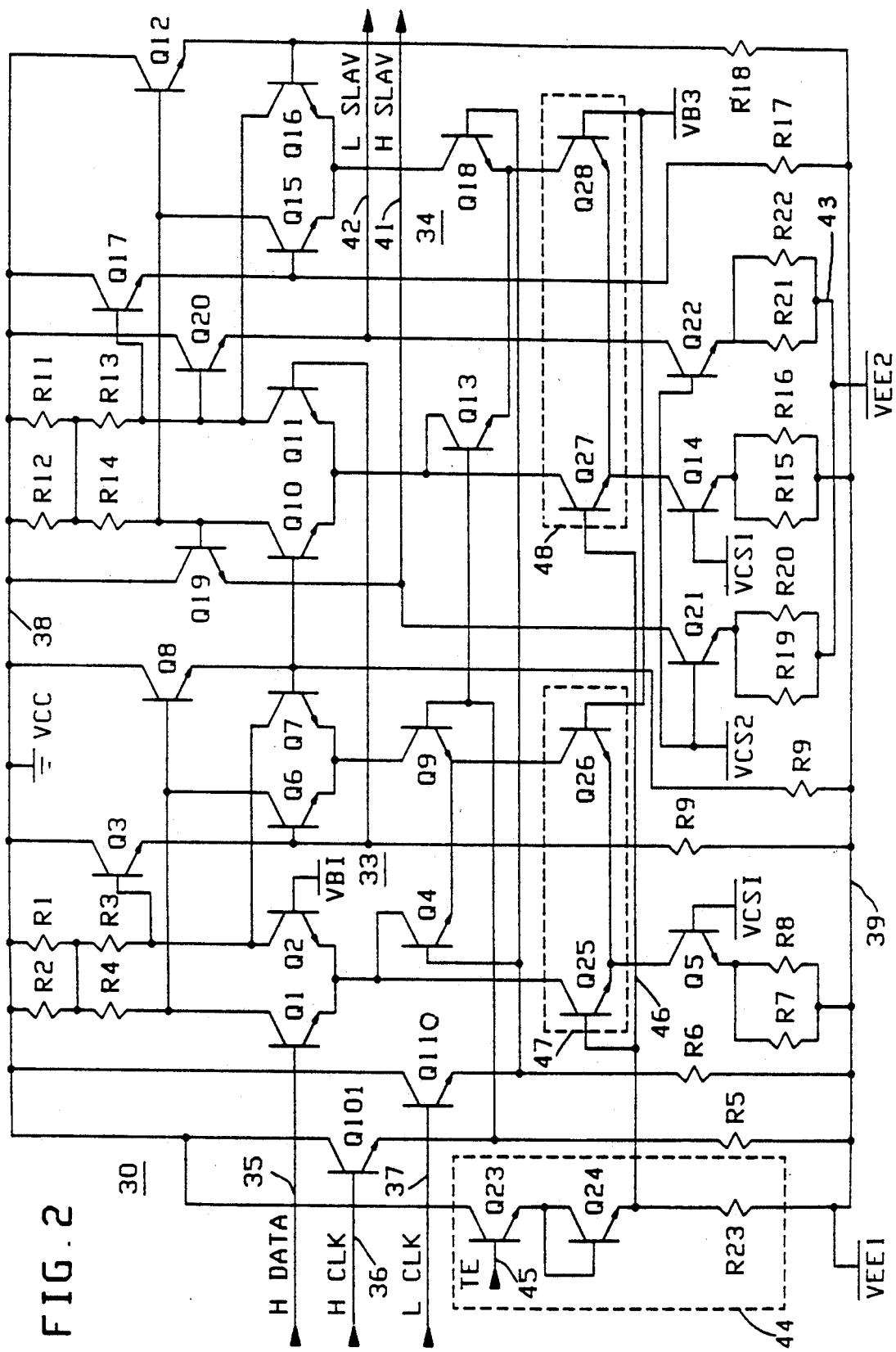
FIG. 2 is a schematic circuit diagram of a "D" type flip-flop which would be used throughout the master-clock chip of FIG. 1 and requires testing and/or critical adjustment before the chip is approved for use in a large high speed mainframe computer.

Refer now to FIG. 2 showing a schematic circuit diagram of a two level "D" type flip-flop of the type which would be used throughout the master clock chip of FIG. 1 and requires testing by use of the novel transparent enable circuitry of the present invention. The flip-flop 30 to be tested is shown comprising a master latch 33 and a slave latch 34. The master latch 33 comprise's nine transistors numbered Q1 to Q9 before being modified by the present invention third level switch to be explained in greater detail hereinafter. Master latch 33 is shown having a data input line 35, a high clock input 36 and a low clock input 37. The clock inputs are coupled to the base of, input driver transistors Q101 and Q110. The master latch 33 is shown connected between a high voltage VCC line 38 and the low voltage VEE1 line 39. Latch 33 is coupled between lines 38 and 39 using standard connection procedure employing high/low adjustment resistors R1 to R4, voltage current source (VCS) and source current resistors R5 to R10 as is standard practice.

In similar manner the slave latch 34 is implemented with transistors Q10 through Q18 which are numbered similar to the master latch 33. The slave latch 34 is shown having two output drivers Q19 and Q20 for the high and low slave outputs on lines (pins) 41 and 42 respectively. In similar manner the slave latch 34 is implemented with high/low adjustment resistors R11 through R14 and having a voltage current source (VCS1) and source circuit resistors R15 to R17. The high and low output driving transistors 19 and 20 are shown having source current resistors 19 to 22 respectively coupled to a VEE2 emitter source voltage on line 43.

The above description of the flip-flop 30 comprising a master latch 33 and a slave latch 34 are deemed to be conventional flip-flops of the type employed in high speed mainframe computers implemented in ECL bipolar technology. It will be understood that the master/slave latches 33 and 34 are configured as two level switches wherein the second level switches comprise transistors Q4, Q9 and Q13, Q18. The invention to be explained hereinafter may be implemented in CMOS, TTL, etc., etc. type of technologies without departing from the present invention.

The novel test circuit comprises a test enable/translator 44 shown in phantom line. The test enable input 45 represents an input pin to the flip-flop 30 which is found on the aforementioned chip described in FIG. 1. The present invention modification comprises transistors Q23 and Q24 arranged as a series coupled driver and level shifter connected to the VEE1 voltage line 39 through a current source resistor 23. A test signal or test pattern applied to the test enable (TE) input line 45 appears as an output on line 46 and an input to the base of input transistors Q25 and Q27 in the third level master switch 47 and third level slave switch 48 respectively. The novel transparent test circuit thus comprises the addition of the aforementioned test enable translator 44, third level master switch 47 and third level slave switch 48 all shown in phantom lines applied to the existing flip-flop circuitry 30 of the type which is used throughout numerous circuits in large high speed mainframe computers.

The reference transistors Q26 and Q28 of the third level switches and 47 and 48 have their bases connected to a reference voltage shown as VB3.

The preferred mode of operation of the present invention transparent test circuit is to test the logic which surrounds the flip-flop 30 as distinguished from testing the state of the flip-flop 30 which is the type of test accomplished by a series scan set test circuit. The novel test procedure is accomplished by turning the flip-flop 30 into a buffer circuit. For example, when TE input line 45 is driven high, input transistors 25 and 27 of the master/slave third level switch are turned ON. The buffer circuit 30 will produce on its output lines 41 and 42 the identical data and inverted data respectively introduced to the flip-flop on data input line 35. The buffer 30 will permit applying a test pattern of data on line 35 and enable measuring the delay of data through the flip-flop 30 and permit comparing the output on lines 41 and 42 with other similar output circuitry. It will be understood that the outputs at pins 41 and 42 pass through other circuitry and to their respective output pins. In testing it is necessary to determine the delay between phases and copies of phases at output pins in order to assure that the drivers or phase drivers are synchronized and form a correct window relative to the master oscillator. It will be appreciated that the master oscillator of mainframe computers operate in excess of 200 megahertz which equates to a switching time of 4.6 nanoseconds cycle time. There are extremely tight skew requirements in such circuits. Further, it will be appreciated that it is possible to employ the present invention so as to permit implementation of scanning of the state of the flip-flop 30 as was also accomplished by the prior art series scan set latch logic circuits. This would be accomplished by setting the test enable line 45 high, then setting the data input 35 to the flip-flop to a desired state. Then set a precondition on the clock lines 36 and 37 such that the master or slave latch 33 or 34 would be latched in the condition desired to be tested. When the test enable input 45 is switched to a low condition, either the master latch 33 or the slave latch 34 is latched in the desired test condition. The latch condition can then be clocked out and observed in the manner in which prior art series latch scan circuits were observed.

Figure 3:
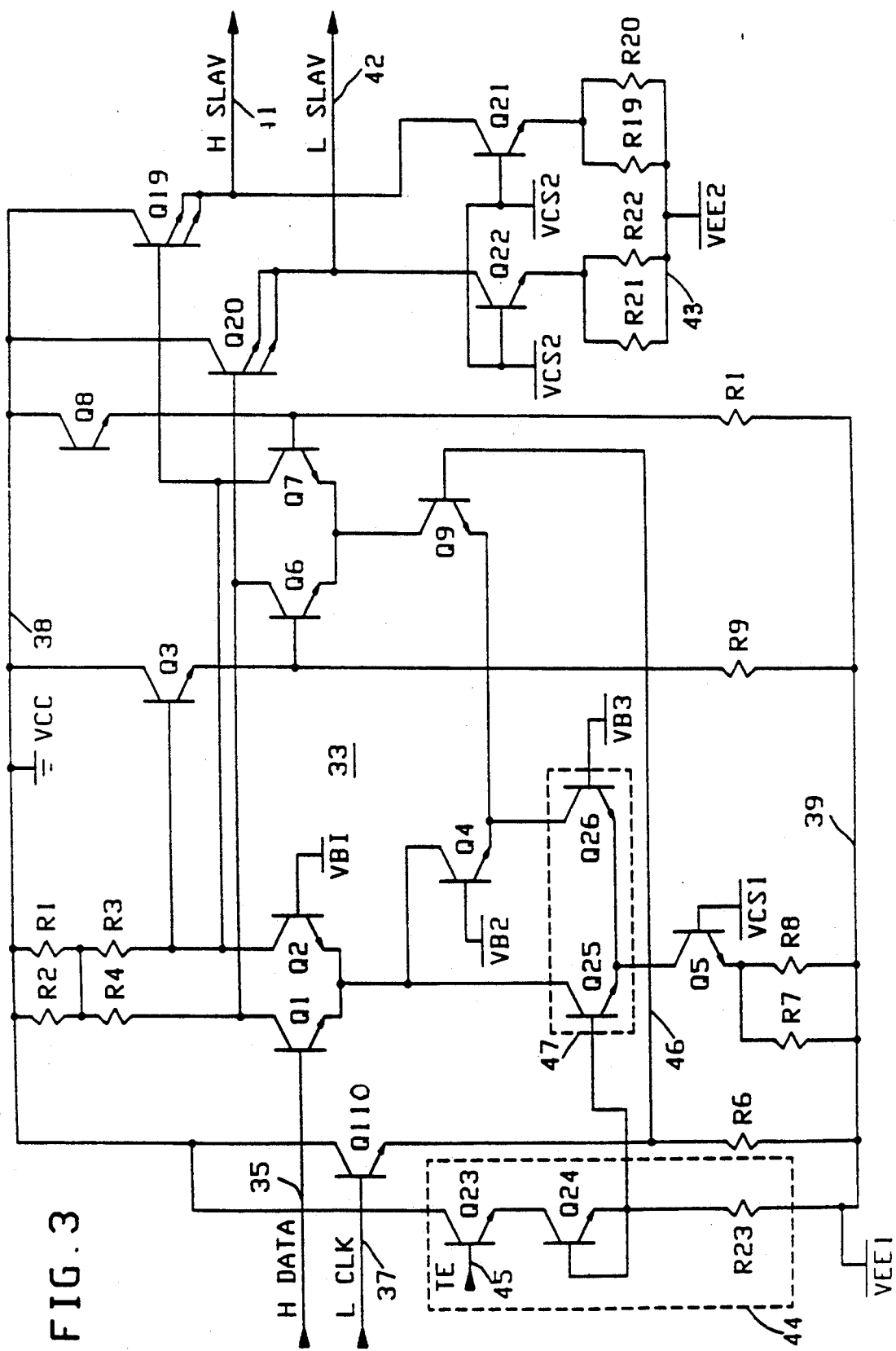
FIG. 3 is a schematic circuit diagram of a "D" type latch which would be used throughout the master clock chip of FIG. 1.

Refer now to FIG. 3 showing a schematic circuit diagram of a "D" type latch which has been modified in the manner explained hereinbefore with reference to FIG. 2 to provide a transparent test circuit for a two level "D" latch modified to have a third level switch 47 and a test enable/translator 44. It will be recognized that the latch circuit 33 is identical to and has been numbered the same as the master latch 33 in FIG. 2 and operates in the identical mode of operation but has been modified so that the output of the master latch 33 drives the output driver circuits that were on the slave latch 34 in FIG. 3. The collectors of transistors Q1 and Q6 are shown coupled to the base of emitter follower driver transistor Q20 as well as being coupled to the base of feedback emitter follower transistor Q8. Similarly, the collectors of transistors Q2 and Q7 are shown coupled to the base of emitter follower driver transistor Q19 as well as coupled to the base of feedback emitter follower transistor Q3. The outputs of transistors Q19 and Q20 are shown providing the aforementioned high/low outputs 41 and 42 which are connected to output pins of the integrated circuit chip on which the latch 33 would appear. It will be noted that the high/low voltage resistors and the current source resistors associated with latch 33 are numbered the same those associated with the master latch 33 shown in FIG. 2 and operate in the same manner. Further, the current source transistors 21 and 22 and their associated current source resistors 19 through 22 in the output driver circuit are numbered the same as the output the circuit in FIG. 2 and operate in the same manner.

In a preferred mode of operation of the present invention, the test and enable input 45 may be placed in a high condition to produce a high output on line 46 which will turn the latch 33 into a transparent circuit enabling data on the input line 35 to appear in its identical form and inverted form on output lines 41 and 42 respectively. Thus, when test input 45 is in a high condition latch 33 operates as a transparent buffer. When test input 45 is in a low condition, latch 33 functions in its mode of a latch and the low clock input on line 37 controls the state of the circuit.

Having explained a preferred embodiment of the present invention and a modification thereof in which the preferred embodiment flip-flop comprises a master latch driving a slave latch. The modified embodiment eliminates the slave latch and the master latch drives the output circuits. It will be appreciated that in both the preferred embodiment and the modification thereof there is a latch circuit which may be tested by the novel transparent enable test circuits which accomplishes the same result as the prior art series scan set latch circuits without the complexity thereof. Further, it will now be appreciated that all the logic which surrounds the prior art flip-flop and latches may be tested in a much simpler test mode of operation. The novel test circuits permits evaluation of the precise timing of numerous types of integrated circuits that would be placed in critical places of high speed mainframe computers before incorporating them into components.

What is claimed is:

1. A transparent enable mode test circuit for testing two level switch devices, comprising:
   an integrated circuit chip device comprising a plurality of two level transistorized switches, having first and second levels to be tested,
   each of said switches to be tested having a data input line for latching data therein,
   each of said switches to be tested being coupled to an output pin on said chip for detecting the state condition of said two level switches,
   transparent enable switch means coupled between said second level of said two level transistorized switches to be tested and a voltage current source for said two level switches,
   said transparent enable switch means having input transistor means and reference transistor means,
   a test enable circuit having an output coupled to the input of said input transistor means of said transparent enable switch means, whereby
   a first level enable test signal applied to said test enable circuit maintains said two level switch in its fixed state and it is enabled to be operable in a transparent mode.

2. A test circuit as set forth in claim 1 wherein one of said plurality of said two level transistor switches to be tested comprises a conventional transistorized latch circuit.

3. A test circuit as set forth in claim 2 wherein said one of said plurality of said two level transistorized switches to be tested comprises a master latch,
   a slave latch coupled to said master latch to form a convention flip-flop therewith, and
   said transparent enable switch means comprises a pair of third level switches coupled between said second level of said two level switches of said master and said slave latches.

4. A test circuit as set forth in claim 2 wherein said conventional transistorized latch circuit comprises an input pair of ECL transistors and an output pair of ECL transistors, and
   an emitter follower driver transistor coupled to each of the outputs of aid output pair of said ECL transistors providing a high and a low slave latch output from said chip.

5. A test circuit as set forth in claim 4 wherein said plurality of two level transistorized switches each comprises a two level flip-flop,
   each of said flip-flops comprises a master and a slave two level latch, and
   each of said two level latches is coupled to a voltage source through one of a pair of third level switches, said one of a pair of third level switches comprising said transparent enable switch means coupled to said test enable circuit.

6. A test circuit a set forth in claim 5 which further includes output driver means coupled to said slave latch of said flip-flop.

7. A test circuit test as set forth in claim 6 wherein said test enable circuit has an output coupled to the inputs of said input transistor means of said transparent enable switch means which comprises the input transistor of each said pair of said third level switches.

8. A method of testing two level transistorized switch device of the type having first and second levels and a voltage current source on a integrated circuit ship, comprising the steps of:
   connecting a third level switch device between the second level of the switch device to be tested and its voltage current source,
   providing a test enable circuit at the input of said chip,
   coupling the output of said test enable circuit to said input of said third level switch device,
   applying a first level signal to said test enable circuit so that said two level switch device is placed in a high state, whereby said two level switch device is placed in a high state, whereby said two level switch device is placed in a transparent mode so that said two level switch device passes data applied to its input directly to the output of said two level device.

9. A method of testing two level transistorized switch device as set forth in claim 8 which further includes the steps of:
   applying a second level signal to said test enable circuit to switch said two level switch device to a reset or low state where said data and a clock applied to said two level switch device will set said two level switch device in an operable mode.

10. A method of testing two level transistorized switch device as set forth in claim 8 wherein said second level of said two level switch device comprises a latch circuit means having a first level input transistor having its base coupled to a data input source, and
    said step of applying said first level signal to said test enable circuit comprises setting said first level input transistor into a conducting state so that data passes through said two level switch device in a transparent mode.

11. A method of testing as set forth in claim 10 which further comprises the steps of:
    applying a test pattern to said data input source coupled to the base of said input transistor.

12. A method of testing as set forth in claim 11 which further includes the steps of:
    recording said test pattern at the output of said latch circuit means.

* * * * *